(12) United States Patent
Chang et al.

(10) Patent No.: US 12,002,847 B2
(45) Date of Patent: Jun. 4, 2024

(54) POWER SEMICONDUCTOR DEVICE AND MANUFACTURING METHOD THEREOF

(71) Applicant: Invinci Semiconductor Corporation, Taipei (TW)

(72) Inventors: Li-Ming Chang, Taipei (TW); Mei-Ling Chen, Taipei (TW); Hsu-Heng Lee, Taipei (TW)

(73) Assignee: Invinci Semiconductor Corporation, Taipei (TW)

( * ) Notice: Subject to any disclaimer, the term of this patent is extended or adjusted under 35 U.S.C. 154(b) by 245 days.

(21) Appl. No.: 17/373,805

(22) Filed: Jul. 13, 2021

(65) Prior Publication Data

US 2022/0140073 A1 May 5, 2022

(30) Foreign Application Priority Data

Oct. 30, 2020 (CN) .......................... 202011190506.5

(51) Int. Cl.
*H01L 29/06* (2006.01)
*H01L 29/78* (2006.01)
*H01L 29/872* (2006.01)

(52) U.S. Cl.
CPC ...... *H01L 29/0611* (2013.01); *H01L 29/7813* (2013.01); *H01L 29/8725* (2013.01)

(58) Field of Classification Search
CPC ............. H01L 29/0611; H01L 29/7813; H01L 29/8725; H01L 29/0619; H01L 29/0696; H01L 29/41766; H01L 29/407; H01L 29/66734; H01L 29/7811; H01L 29/78; H01L 29/0684; H01L 29/402; H01L 29/4236; H01L 29/66477

See application file for complete search history.

(56) References Cited

U.S. PATENT DOCUMENTS

| | | | | |
|---|---|---|---|---|
| 6,204,097 | B1 * | 3/2001 | Shen | H01L 29/7802 257/E29.066 |
| 10,468,402 | B1 * | 11/2019 | Park | H01L 29/7813 |
| 10,685,955 | B2 * | 6/2020 | Park | H01L 27/0255 |
| 2007/0004116 | A1 * | 1/2007 | Hshieh | H01L 29/66734 438/589 |
| 2007/0145411 | A1 * | 6/2007 | Chen | H01L 29/16 257/173 |

(Continued)

*Primary Examiner* — Shahed Ahmed
*Assistant Examiner* — Khatib A Rahman
(74) *Attorney, Agent, or Firm* — JCIPRNET

(57) ABSTRACT

A power semiconductor device includes an epitaxial layer of a first conductivity type, a first doped region of a second conductivity type, a second doped region of the first conductivity type, a contact metal layer, a device electrode, a first termination electrode, and a second termination electrode. The epitaxial layer includes an active region and a termination region.

The device electrode is located in a device trench in the active region, and is electrically isolated from the epitaxial layer and the contact metal layer. The first termination electrode is located in a first termination trench in the termination region and is electrically isolated from the epitaxial layer. The second termination electrode is located at a bottom of the first termination trench and is electrically isolated from the first termination electrode and the epitaxial layer. Both the first termination electrode and the second termination electrode are capable of being selectively floating.

15 Claims, 11 Drawing Sheets

(56) References Cited

U.S. PATENT DOCUMENTS

| | | | |
|---|---|---|---|
| 2019/0348510 A1* | 11/2019 | Yilmaz | H01L 29/4236 |
| 2019/0393218 A1* | 12/2019 | Lui | H01L 29/7828 |
| 2020/0303507 A1* | 9/2020 | Yilmaz | H01L 29/4236 |

* cited by examiner

POWER SEMICONDUCTOR DEVICE AND MANUFACTURING METHOD THEREOF

CROSS-REFERENCE TO RELATED APPLICATION

This application claims the priority benefit of China application serial no. 202011190506.5, filed on Oct. 30, 2020. The entirety of the above-mentioned patent application is hereby incorporated by reference herein and made a part of the disclosure.

BACKGROUND

Technical Field

The disclosure relates to a power electronic device and a manufacturing method thereof, and in particular to a power semiconductor device and a manufacturing method thereof.

Description of Related Art

Power semiconductor devices are commonly used in switch-mode power supplies or other high-speed power switching devices. Generally, in addition to being capable of passing large currents in an active region, power semiconductor devices are also required to be capable of withstanding a large breakdown voltage in a termination region. Several power semiconductor devices (e.g., a Schottky barrier diode, a metal-oxide-semiconductor field-effect transistor, or a metal-oxide-semiconductor Schottky diode) have already been extensively used. However, since the general plate-type Schottky barrier diode has the problem of a low breakdown voltage, the trench MOS barrier Schottky diode (TMBS diode) has later been developed.

Taking the trench MOS barrier Schottky diode as an example, the formation of a typical power semiconductor device mainly involves first forming an N− epitaxial layer on an N+ substrate, then forming multiple trench gates in the N− epitaxial layer, and then forming a gate oxide layer between the trench gate and the N− epitaxial layer. Next, a Schottky barrier metal layer and an anode metal are deposited on the surface of the N− epitaxial layer and the surface of the trench gate.

However, as the integration of power semiconductor devices increases, the gate-drain charge (Qgd) also increases, which results in a drop in the charging/discharging speed of the gate and affects the performance of the device. To reduce the gate-drain charge to improve the switching loss of the device, the capacitance of the device should be reduced, for example, by using a separate gate structure to reduce the gate-drain area. However, doing so will complicate the charge balance of the device.

Therefore, there is a need to provide an improved power semiconductor device and a manufacturing method thereof to solve the problems in the art.

SUMMARY

An embodiment of the disclosure provides a power semiconductor device including an epitaxial layer, a first doped region, a second doped region, a contact metal layer, a gate electrode, a first termination electrode, and a second termination electrode. The epitaxial layer is of a first conductivity type and includes an active region and a termination region. The first doped region is of a second conductivity type and is located in the epitaxial layer of the active region. The second doped region is of the first conductivity type and is located in the first doped region. The contact metal layer is located on the epitaxial layer and is in electrical contact with the second doped region. The gate electrode is located in a device trench in the active region and is electrically isolated from the epitaxial layer and the contact metal layer. The first termination electrode is located in a first termination trench in the termination region and is electrically isolated from the epitaxial layer. The second termination electrode is located at a bottom of the first termination trench and is electrically isolated from the first termination electrode and the epitaxial layer. Both the first termination electrode and the second termination electrode are capable of being selectively floating or in electrical contact with the contact metal layer.

Another embodiment of the disclosure provides a method for manufacturing a power semiconductor device, including the following steps. First, an epitaxial layer of a first conductivity type is provided, and the epitaxial layer includes an active region and a termination region. A first doped region of a second conductivity type is formed in the epitaxial layer of the active region. A second doped region of the first conductivity type is formed in the first doped region. A contact metal layer is formed on the epitaxial layer, and the contact metal layer is in electrical contact with the second doped region. A gate electrode is formed in the active region, and the gate electrode is located in a device trench extending into the epitaxial layer and is electrically isolated from the epitaxial layer and the contact metal layer. A first termination electrode is formed in the termination region, and the first termination electrode is located in a first termination trench extending into the epitaxial layer and is electrically isolated from the epitaxial layer. A second termination electrode is formed at a bottom of the first termination trench, and the second termination electrode is electrically isolated from the first termination electrode and the epitaxial layer. Both the first termination electrode and the second termination electrode are capable of being selectively floating or in electrical contact with the contact metal layer.

According to the above embodiments, the disclosure provides a power semiconductor device and a manufacturing method thereof. At least one trench is provided in the termination region of the power semiconductor device having a trench structure. At least two termination electrode field plates vertically stacked on each other and isolated from each other are disposed in the trench and are both electrically connected to the source or are both floating; alternatively, one of them is electrically connected to the source and the other is floating. The power semiconductor device having a trench structure may be (but is not limited to), for example, a metal-oxide-semiconductor field-effect transistor, a metal-oxide-semiconductor Schottky diode, a Schottky barrier diode, or another suitable power semiconductor device. In addition, the number of trenches and the selection of the connections of the termination electrode field plates may be designed in advance according to the electric field requirements during the operation of the power semiconductor device to thereby improve the charge balance of the power metal-oxide-semiconductor transistor cell.

The foregoing summary is only a general overview of each aspect of the disclosure and meanwhile presents some related concepts of the disclosure which will be further described in detail in the following embodiments. The foregoing summary is not intended to limit the key or essential features of the claimed disclosure, nor is it intended to independently limit the scope of the disclosure claimed herein. The scope of the disclosure claimed herein shall be determined by the appended claims. By referring to the overall disclosure of the following description, the drawings, and each of the claims, the technical content of the above and other aspects of the disclosure can be better understood.

BRIEF DESCRIPTION OF THE DRAWINGS

In order to make the above-mentioned features and advantages of the disclosure more understandable, the following specific embodiments are described in detail as follows. However, it is noted that these specific implementation examples and implementation methods are not intended to limit the disclosure. The disclosure can still be implemented by adopting other features, elements, methods, and parameters. The exemplary embodiments are only used to illustrate the technical features of the disclosure, and are not intended to limit the claims of the disclosure.

DESCRIPTION OF THE EMBODIMENTS

Figure 1A:
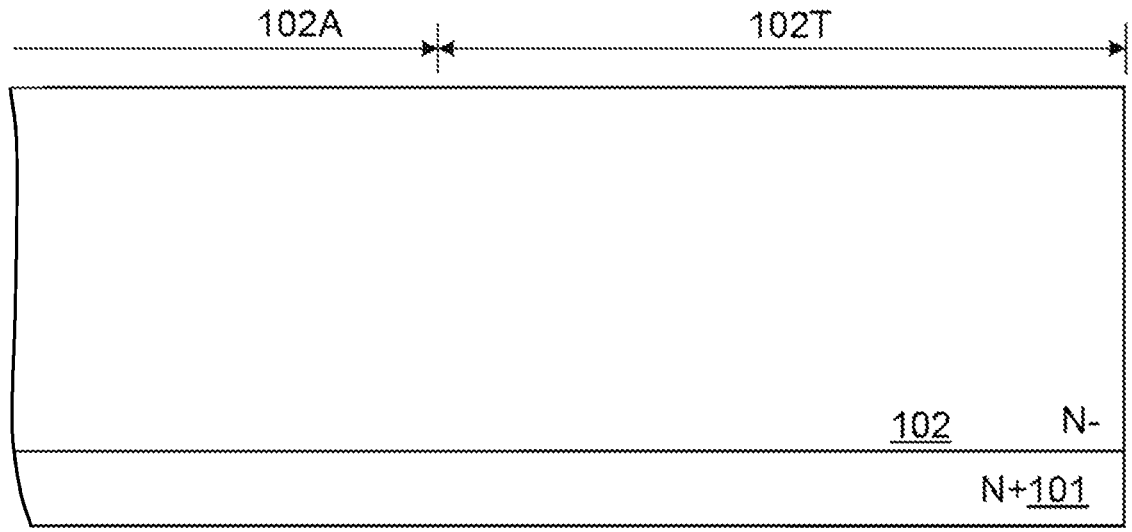
FIG. 1A to FIG. 1G are schematic cross-sectional structural views showing a series of process steps for manufacturing a power semiconductor device according to an embodiment of the disclosure.

The disclosure provides a power semiconductor device and a manufacturing method thereof, which can adjust an electric field distribution of a termination region of the power semiconductor device to improve a charge balance during the operation of the power semiconductor device. Multiple embodiments will be presented below and described with reference to the attached drawings. In the drawings, similar reference numerals are used to indicate similar or equivalent components. The drawings are only illustrative and may not be drawn to scale. The following embodiments only exemplarily illustrate limited scope and embodiments of the disclosure.

It is understood that the specific details, connection relationships, and manufacturing methods described herein are only intended to enhance understanding. Those skilled in the art may easily ignore one or more specific details or components, or may implement the disclosure by other methods. In order to avoid rendering the disclosure obscure, the existing structures or operation methods will not be repeatedly described herein. The sequence of steps or components in different embodiments is not limited by the illustrated descriptions. Therefore, in some embodiments, the execution sequence of the steps or the assembly sequence of the components may be the same as or different from the embodiments shown herein. In addition, not all the illustrated steps or components are essential to the implementation of the disclosure.

Referring to FIG. 1A to FIG. 1G, FIG. 1A to FIG. 1G are schematic cross-sectional structural views showing a series of process steps for manufacturing a power semiconductor device 100 according to an embodiment of the disclosure. The method for manufacturing the power semiconductor device 100 includes the following steps. First, an epitaxial layer 102 of a first conductivity type is provided on a semiconductor substrate 101. In some embodiments of the disclosure, the semiconductor substrate 101 may include a semiconductor substrate layer having an n-type dopant (e.g., pentavalent atoms such as arsenic, phosphorus, and antimony). In some embodiments of the disclosure, the material forming the semiconductor substrate layer may be, for example, monocrystalline silicon, polysilicon, or silicon carbide (SiC). In this embodiment, the semiconductor substrate 101 may be a wafer including a monocrystalline silicon layer.

In some embodiments of the disclosure, an epitaxial deposition process such as physical vapor deposition (PVD) or chemical vapor deposition (CVD) may be performed to grow a semiconductor epitaxial layer 102 having an n-type dopant on the semiconductor substrate 101.

The material of the semiconductor substrate 101 and the material of the semiconductor epitaxial layer 102 may be the same or different. The doping concentration of the n-type dopant in the semiconductor substrate 101 is greater than the doping concentration of the n-type dopant in the epitaxial layer 102.

For example, in this embodiment, a monocrystalline silicon epitaxial layer 102 having an n-type dopant may be formed on the monocrystalline silicon semiconductor substrate 101 having an n-type dopant by molecular beam epitaxy (MBE), but the disclosure is not limited thereto. In some embodiments of the disclosure, the epitaxial layer 102 may be divided into at least one active region 102A and a termination region 102T located on the outer side of the active region (as shown in FIG. 1A).

Figure 1B:
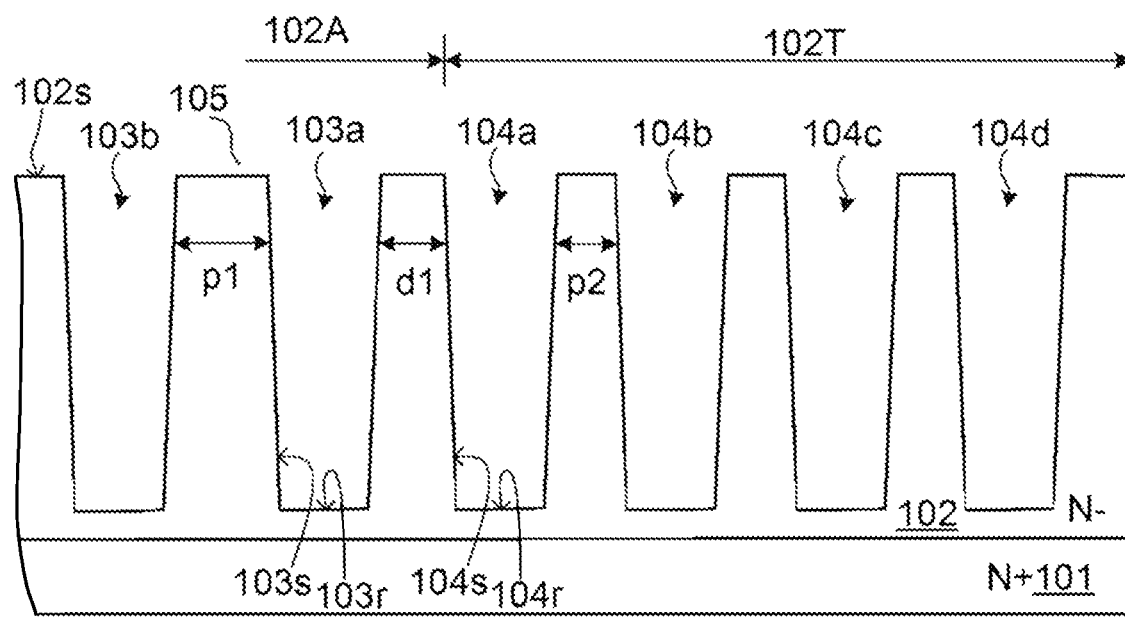

Referring to FIG. 1B, next, a photolithography and etching process is performed at least once on the epitaxial layer 102 to respectively form multiple device trenches (e.g., device trenches 103a and 103b) in the active region 102A of the epitaxial layer 102 and form multiple termination trenches (e.g., termination trenches 104a, 104b, 104c, and 104d) in the termination region 102T of the epitaxial layer 102. In some embodiments of the disclosure, the device trenches 103a and 103b and the termination trenches 104a, 104b, 104c, and 104d may be formed by different photolithography and etching processes.

In this embodiment, the device trenches 103a and 103b and the termination trenches 104a, 104b, 104c, and 104d are simultaneously formed by the same one photolithography and etching process. The device trenches 103a and 103b and the termination trenches 104a, 104b, 104c, and 104d respectively extend from a surface 102s of the epitaxial layer 102 downward into the epitaxial layer 102 (as shown in FIG. 1B). A pitch P1 between the device trenches 103a and 103b may be the same as or different from a pitch P2 between the termination trenches 104a, 104b, 104c, and 104d. In addition, a distance dl between the device trench 103a at the periphery of the active region 102A and the termination trench 104a at the periphery of the termination region 102T may be the same as or different from the pitch P1 or P2.

Figure 1C:
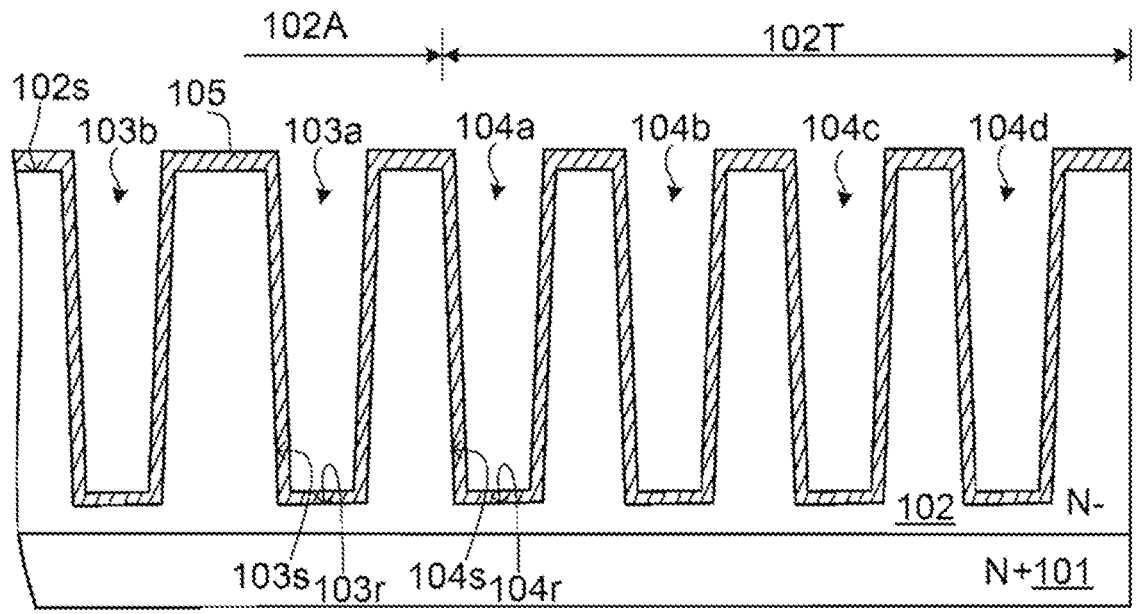

Referring to FIG. 1C, then, a dielectric layer 105 is formed on the epitaxial layer 102 so that the dielectric layer 105 respectively covers bottoms 103r and sidewalls 103s of the device trenches 103a and 103b and covers bottoms 104r and sidewalls 104s of the termination trenches 104a, 104b, 104c and 104d (as shown in FIG. 1C).

Figure 1D:
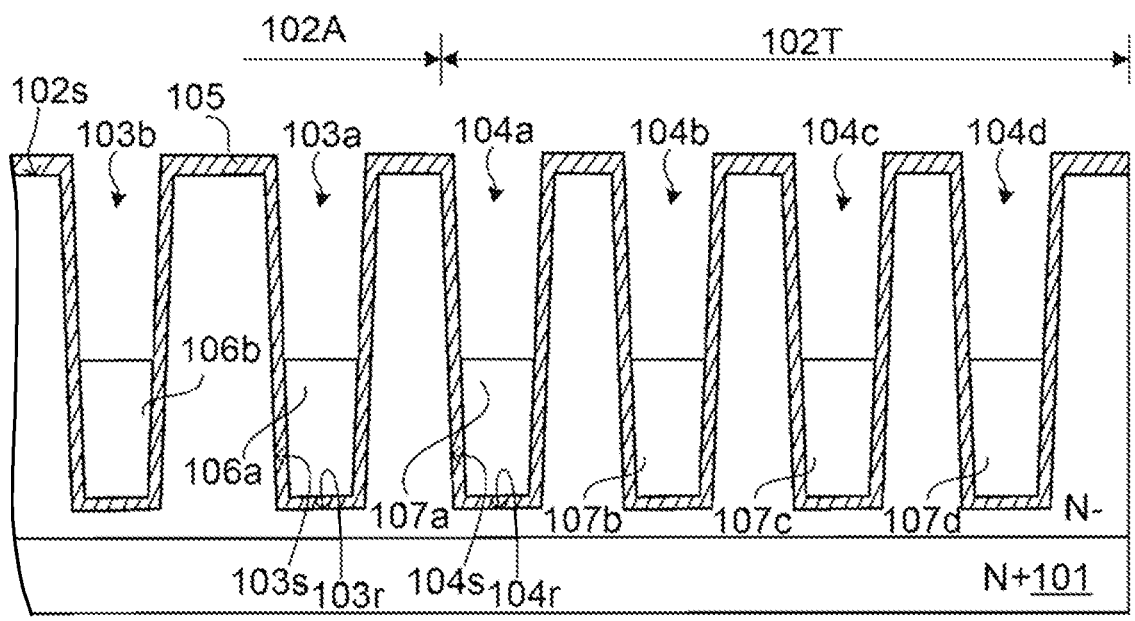

Next, a conductive material (e.g., a polysilicon material) is deposited on the gate dielectric layer 105 to fill the device trenches 103a and 103b and the termination trenches 104a, 104b, 104c, and 104d. The polysilicon material on the gate dielectric layer 105 is removed by using the dielectric layer 105 as a stop layer. Then, another photolithography and etching process (not shown) or an etch-back process is performed to remove part of the polysilicon material located in the device trenches 103a and 103b and the termination trenches 104a, 104b, 104c and 104d to respectively form separated electrodes 106a and 106b at the bottoms 103r of the device trenches 103a and 103b and respectively form lower termination electrodes 107a, 107b, 107c, and 107d at the bottoms 104r of the termination trenches 104a, 104b, 104c, and 104d (as shown in FIG. 1D).

Figure 1E:
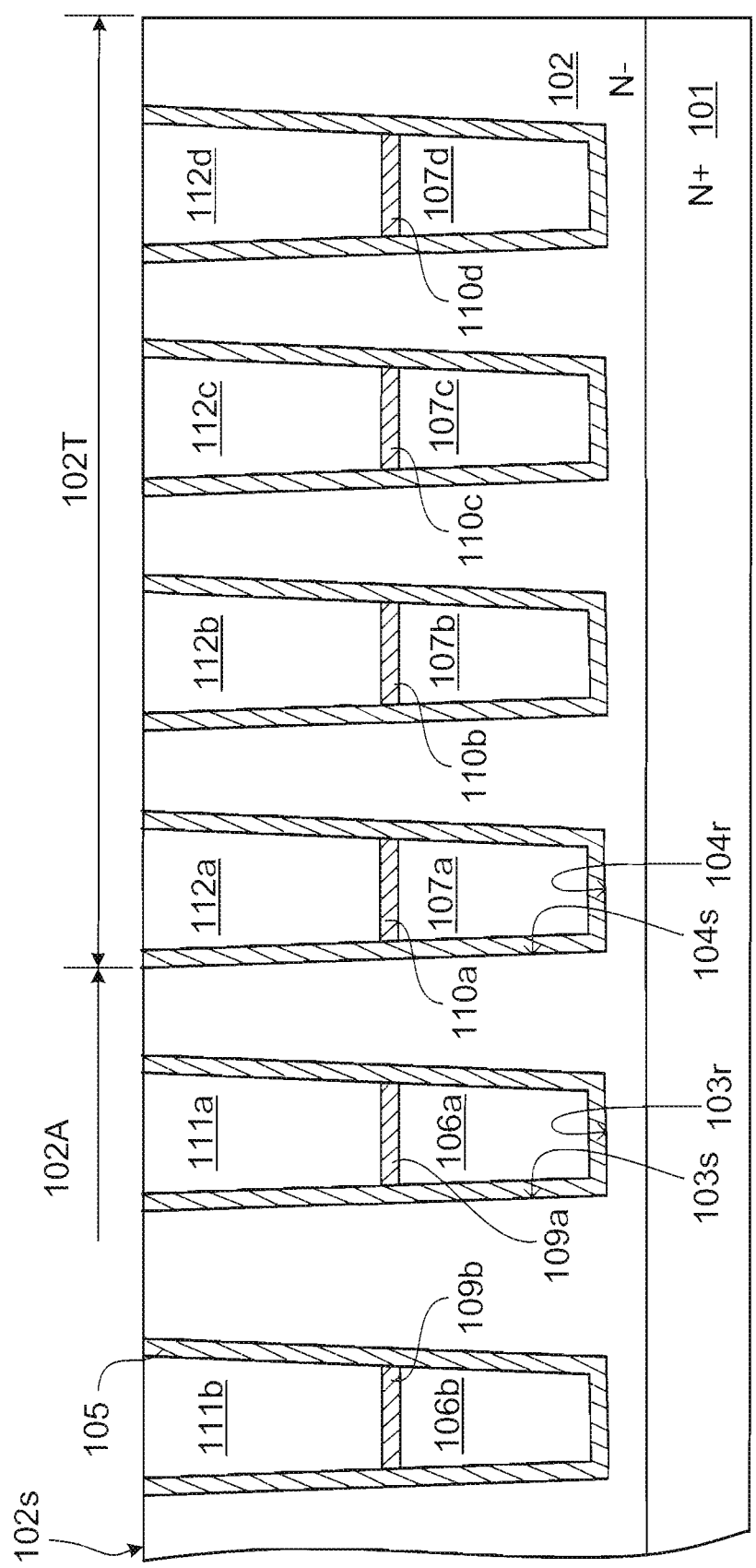

Referring to FIG. 1E, then, by a thermal oxidation or deposition process, dielectric isolating layers 109a and 109b are respectively formed on the separated electrodes 106a and 106b, and meanwhile (but not limited thereto), dielectric isolating layers 110a, 110b, 110c, and 110d are formed on the lower termination electrodes 107a, 107b, 107c, and 107d. Moreover, a conductive material (e.g., a polysilicon material) is deposited to cover the epitaxial layer 102 and fill the device trenches 103a and 103b and the termination trenches 104a, 104b, 104c, and 104d. After the conductive material covering the epitaxial layer 102 is removed by a planarization process, gate electrodes (or referred to as device electrodes) 111a and 111b are formed in the device trenches 103a and 103b, and upper termination electrodes 112a, 112b, 112c, and 112d are formed in the termination trenches 104a, 104b, 104c, and 104d.

In this embodiment, the gate electrodes 111a and 111b are respectively stacked on the separated electrodes 106a and 106b and are electrically isolated from the separated electrodes 106a and 106b respectively by the dielectric isolating layers 109a and 109b. The upper termination electrodes 112a, 112b, 112c, and 112d are respectively stacked on the lower termination electrodes 107a, 107b, 107c, and 107d and are electrically isolated from the lower termination electrodes 107a, 107b, 107c, and 107d respectively by the dielectric isolating layers 110a, 110b, 110c, and 110d.

The gate electrodes 111a and 111b and the separated electrodes 106a and 106b are respectively electrically isolated from the epitaxial layer 102 in the active region 102A by part of the dielectric layer 105 formed on the bottoms 103r and the sidewalls 103s of the device trenches 103a and 103b. The upper termination electrodes 112a, 112b, 112c, and 112d and the lower termination electrodes 107a, 107b, 107c, and 107d are respectively electrically isolated from the epitaxial layer 102 in the termination region 102T by part of the dielectric layer 105 formed on the bottoms 104r and the sidewalls 104s of the termination trenches 104a, 104b, 104c, and 104d (as shown in FIG. 1E).

Figure 1F:
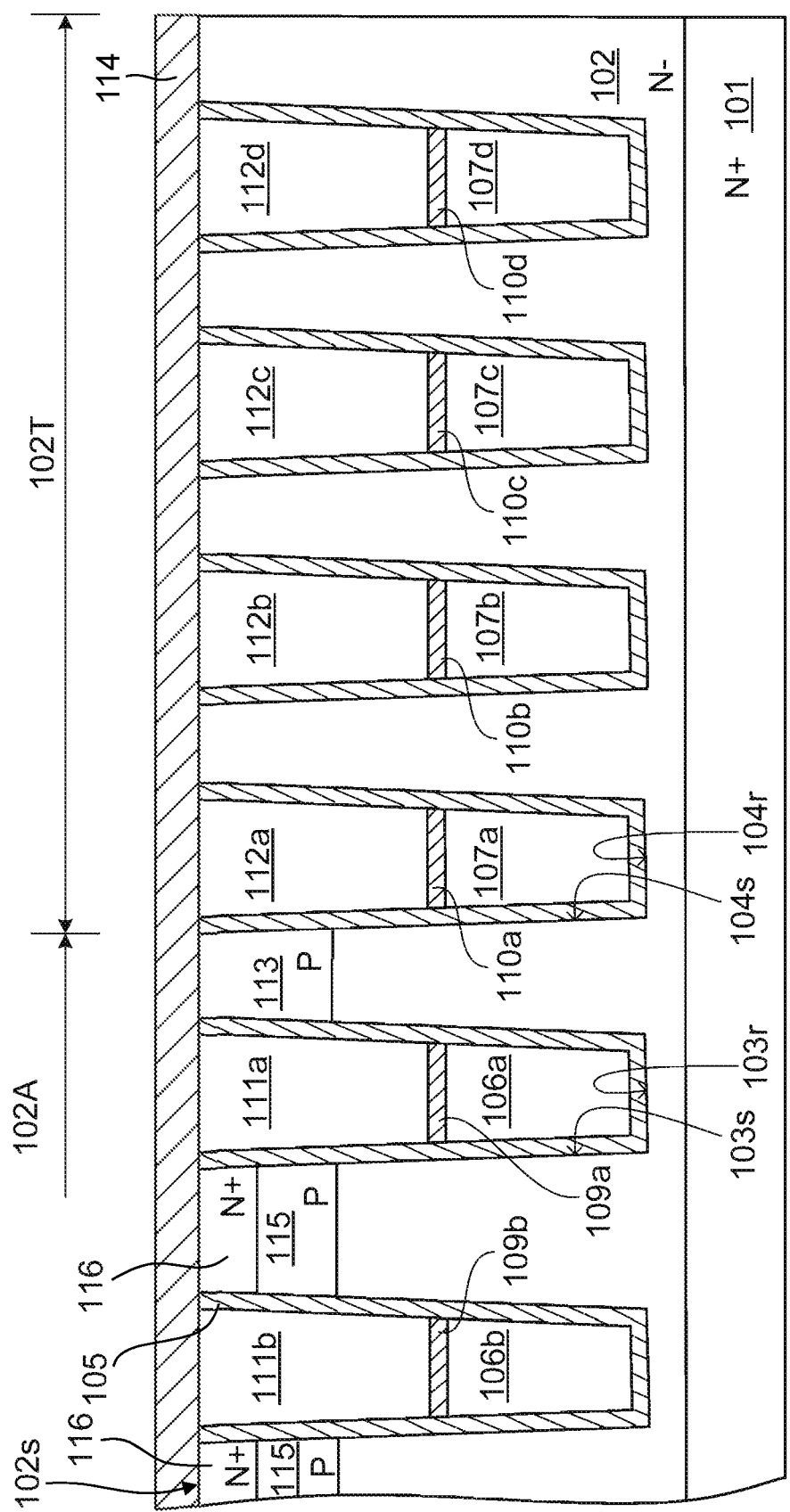

Next, a series of back-end-of-line (BEOL) processes are performed. First, a dielectric protective layer 114 is formed on the active region 102A and the termination region 102T. The material of the dielectric protective layer 114 includes silicon oxide. The termination region 102T is masked by a mask (not shown), and an ion implantation process is performed multiple times on the active region 102A to form multiple p-type doped well regions 115 in the epitaxial layer 102 in the active region 102A. Further, a p-type boundary doped region 113 is formed between the device trench 103a at the periphery of the active region 102A and the termination trench 104a at the periphery of the termination region 102T. Then, multiple n-type source doped regions 116 are formed in the doped well regions 115 to be respectively adjacent to the corresponding gate electrodes 111a and 111b (as shown in FIG. 1F).

Afterwards, the dielectric protective layer 114 is patterned by a photolithography and etching process (not shown) to form multiple openings to expose the source doped regions 116 located in the active region 102A. Next, a contact metal layer 118 is formed on the patterned dielectric protective layer 114 and is filled in the openings to form contact plugs 117a and 117b which are respectively in electrical contact with the source doped regions 116. In this embodiment, the contact metal layer 118 also covers the termination region 102T and overlaps with all of the upper termination electrodes 112a, 112b, 112c, and 112d and the lower termination electrodes 107a, 107b, 107c, and 107d located in the termination region 102T. Moreover, the contact metal layer 118 is electrically isolated from part of the epitaxial layer 102 located in the termination region 102T by the patterned dielectric protective layer 114. In some embodiments, the contact metal layer 118 may overlap with all of the upper termination electrodes 112a, 112b, 112c, and 112d and all of the lower termination electrodes 107a, 107b, 107c, and 107d located in the termination region 102T. However, in other embodiments, the contact metal layer 118 may overlap with only part of the upper termination electrodes 112a, 112b, 112c, and 112d and part of the lower termination electrodes 107a, 107b, 107c, and 107d located in the termination region 102T.

In some embodiments of the disclosure, an ion implantation process may also be optionally performed on the outer side of the termination trenches 104a, 104b, 104c, and 104d to form a p-type annular doped region 123 surrounding the termination region 102T. In this embodiment, a doping depth t1 of the annular doped region 123 is greater than a doping depth t2 of the p-type doped well region 115.

Figure 1G:
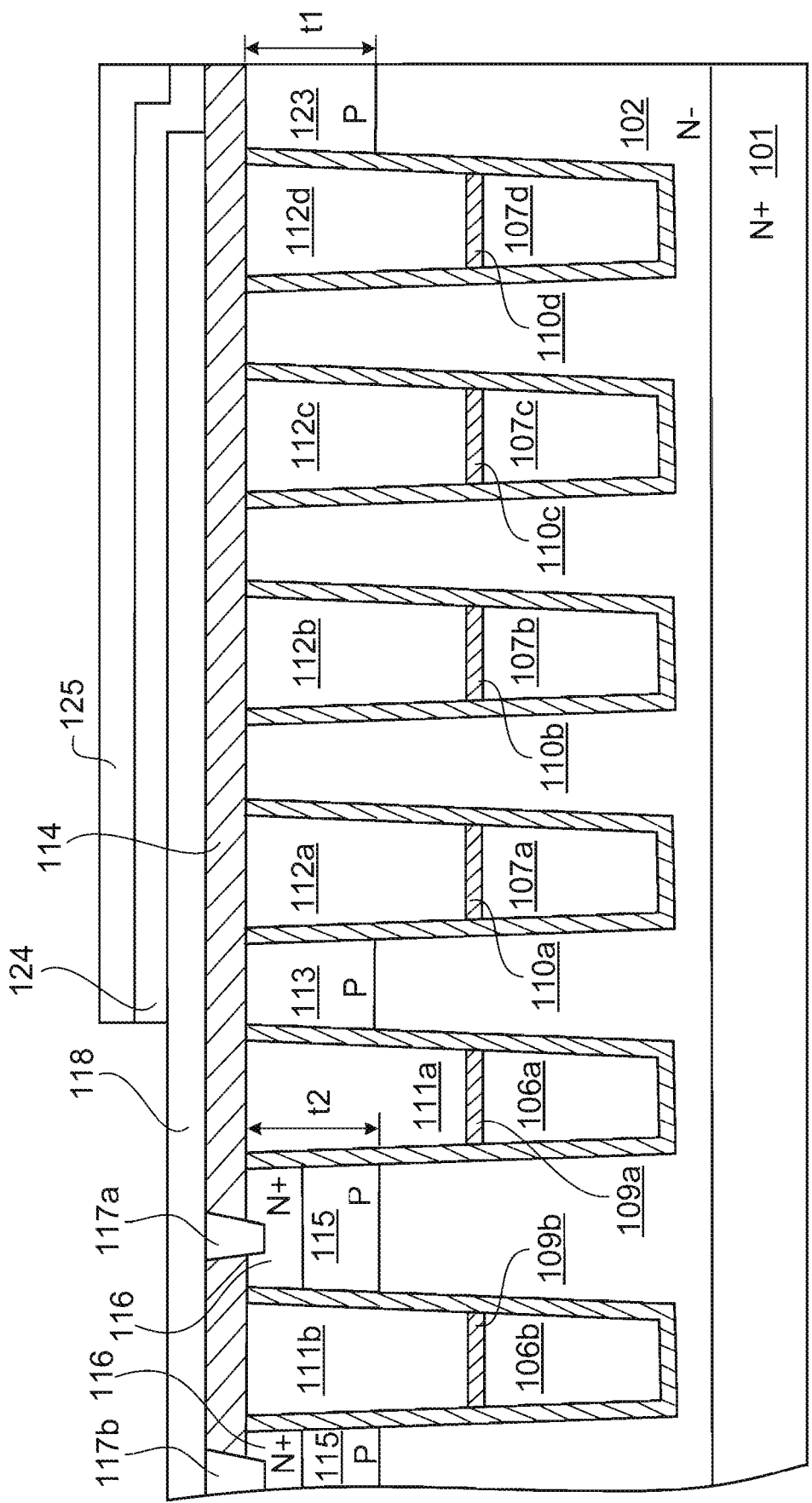

In addition, an upper dielectric layer 124 and a passivation layer 125 may also be formed on the termination region 102T to cover the contact metal layer 118 on the termination trenches 104a, 104b, 104c, and 104d. In some embodiments of the disclosure, the upper dielectric layer 124 may include silicon nitride, polyimide (PI), or a multilayer structure thereof. The passivation layer 125 may be a silicon oxide layer, silicon nitride, a plasticized layer (e.g., a polyimide (PI) layer), or a combination thereof (as shown in FIG. 1G).

In some embodiments, when the series of back-end-of-line (BEOL) processes are performed, according to the design of the power semiconductor device 100, multiple contact plugs 119a, 119b, 119c, 119d, 119a', and 119b' may be respectively formed in the termination region 102T (to be detailed below), so that the upper termination electrodes 112a, 112b, 112c, and 112d and the lower termination electrodes 107a, 107b, 107c, and 107d in the termination trenches 104a, 104b, 104c, and 104d are selectively in electrical contact with the contact metal layer 118. Furthermore, the subsequent process also includes forming multiple contact plugs 120a and 120b in the active region 102A, so that the separated electrodes 106a and 106b are in electrical contact with the contact metal layer 118 via the contact plugs 120a and 120b. The subsequent process also includes forming a gate metal structure 121 on the outer side of the termination trenches 104a, 104b, 104c, and 104d, and the gate metal structure 121 is brought into electrical contact respectively with the gate electrodes 111a and 111b via contact plugs 122a and 122b, thereby completing the preparation of the power semiconductor device 100 as shown in FIG. 2A to FIG. 2C.

Figure 2A:
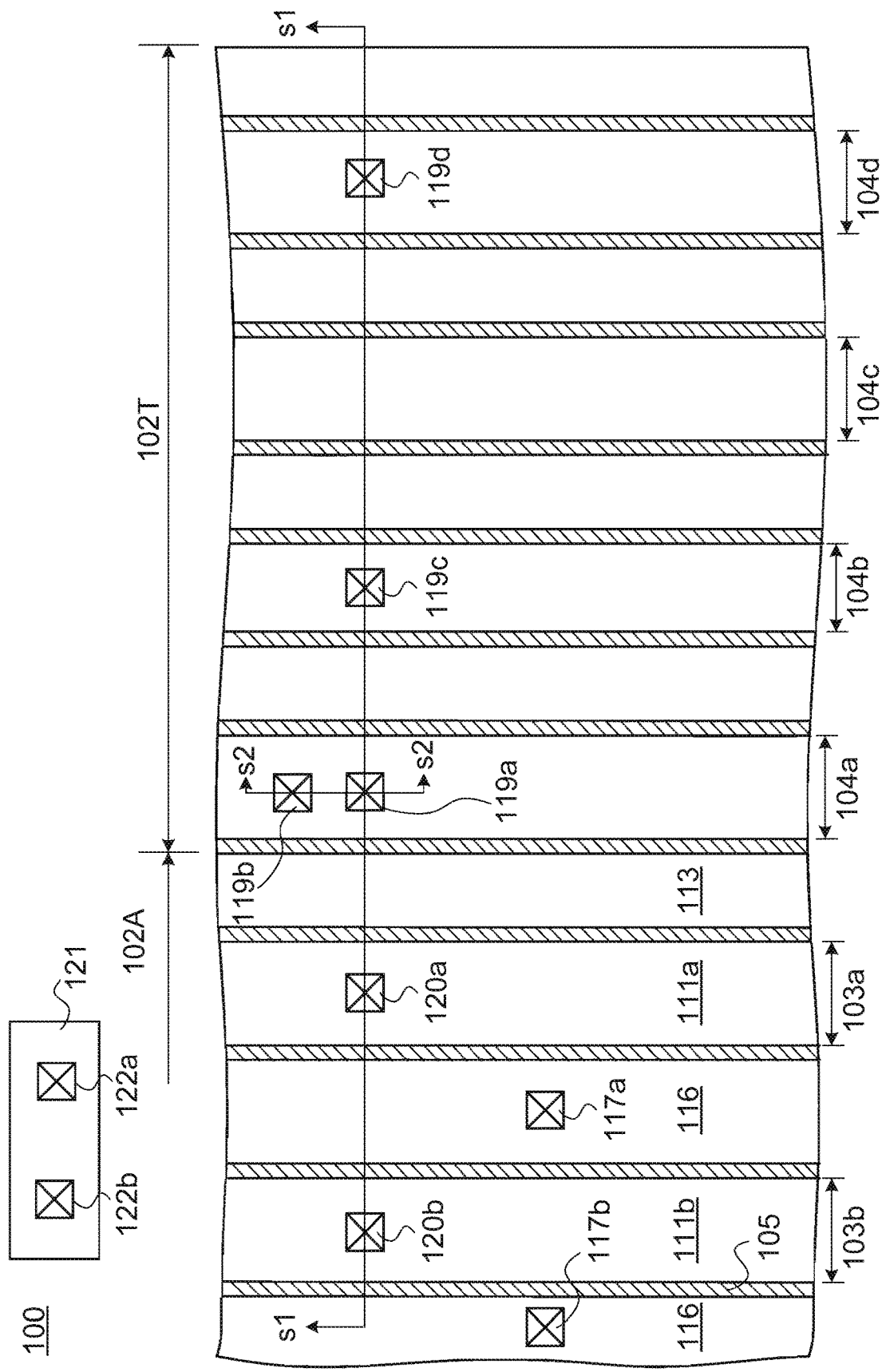
FIG. 2A is a top view showing part of a wiring structure of the power semiconductor device according to an embodiment of the disclosure.
Figure 2B:
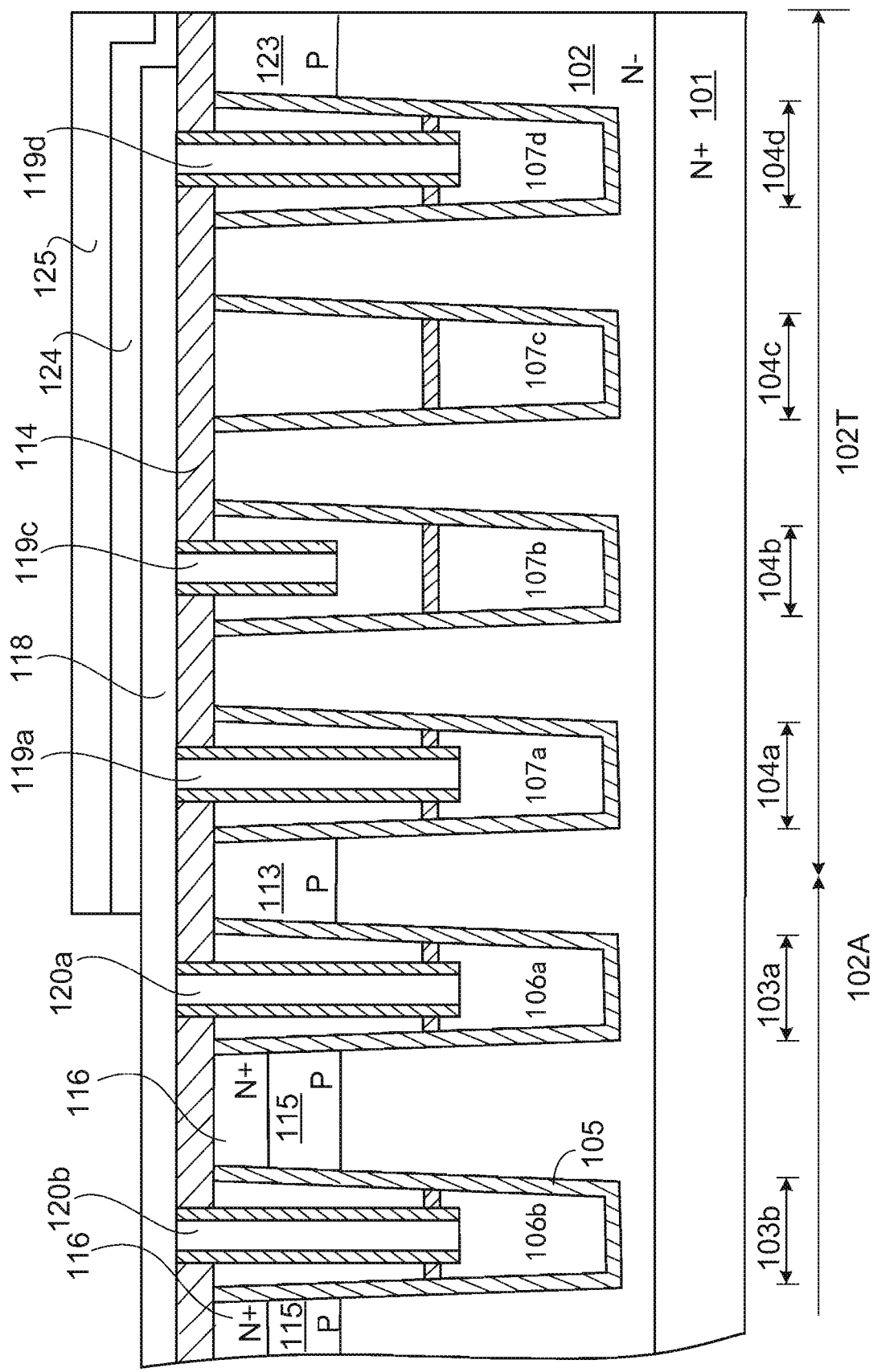
FIG. 2B is a partial cross-sectional structural view of the power semiconductor device taken along line S1 in FIG. 2A.
Figure 2C:
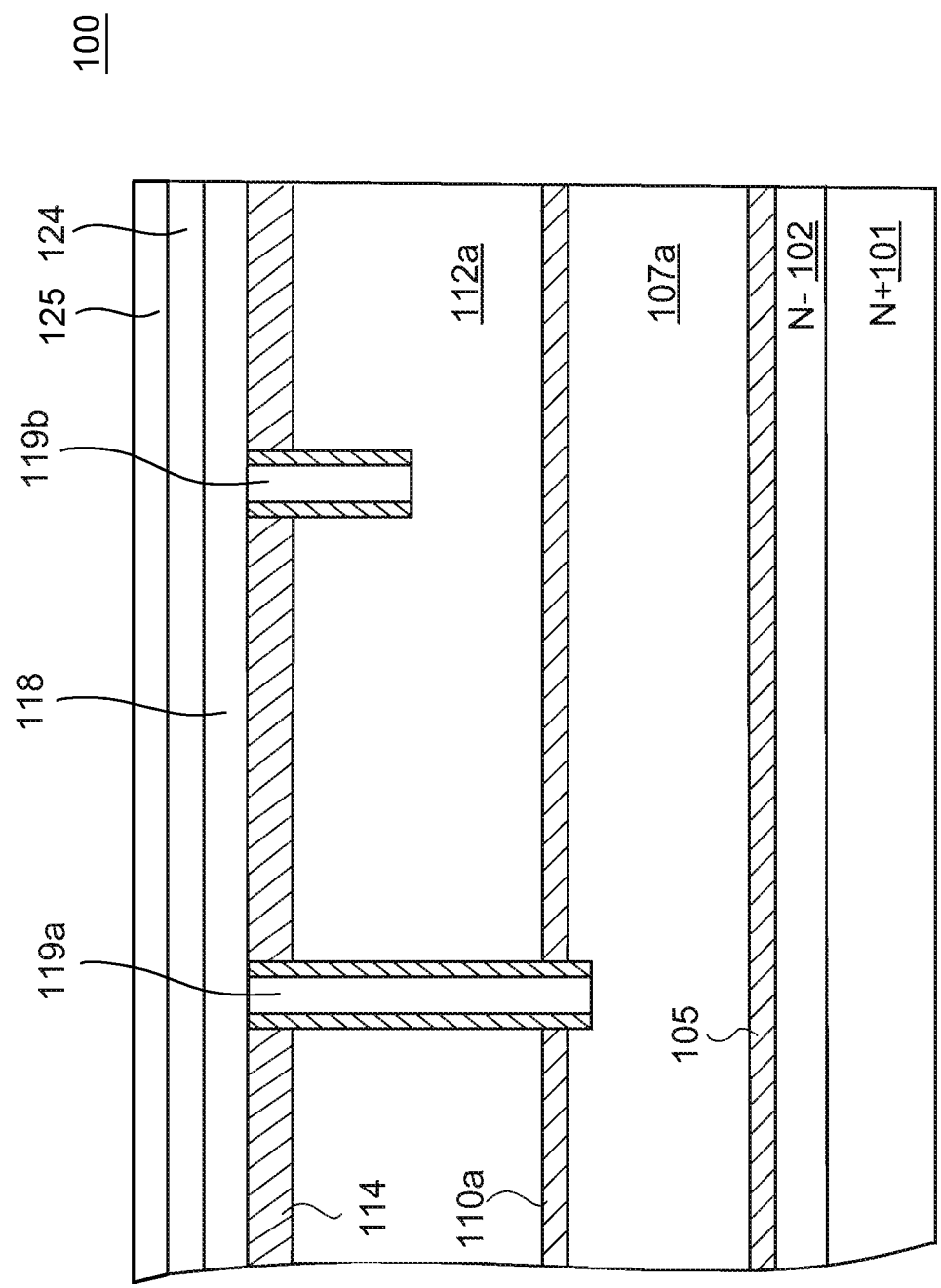
FIG. 2C is a partial cross-sectional structural view of the power semiconductor device taken along line S2 in FIG. 2A.

FIG. 2A is a top view showing part of a wiring structure of the power semiconductor device 100 according to an embodiment of the disclosure. FIG. 2B is a partial cross-sectional structural view of the power semiconductor device 100 taken along line S1 in FIG. 2A. FIG. 2C is a partial cross-sectional structural view of the power semiconductor device 100 taken along line S2 in FIG. 2A.

In this embodiment, the upper termination electrode 112a and the lower termination electrode 107a located in the termination trench 104a are in electrical contact with the contact metal layer 118 respectively via the contact plugs 119a and 119b. The upper termination electrode 112b located in the termination trench 104b is in electrical contact with the contact metal layer 118 via the contact plug 119c. The lower termination electrode 107b located in the termination trench 104b is floating and is not in electrical contact with any metal layer or conductive line. The upper termination electrode 112c and the lower termination electrode 107c located in the termination trench 104c are also floating and are not in electrical contact with any metal layer or conductive line. The lower termination electrode 107d located in the termination trench 104d is in electrical contact with the contact metal layer 118 via the contact plug 119d. The upper termination electrode 112d located in the termination trench 104d is floating and is not in electrical contact with any metal layer or conductive line.

By selecting (changing) the electrical connections of the upper termination electrodes 112a, 112b, 112c, and 112d and the lower termination electrodes 107a, 107b, 107c, and 107d located in the termination trenches 104a, 104b, 104c, and 104d, the electric field distribution during the operation of the power semiconductor device 100 can be adjusted, which helps to improve the charge balance of the power metal-oxide-semiconductor transistor cell.

Figure 2D:
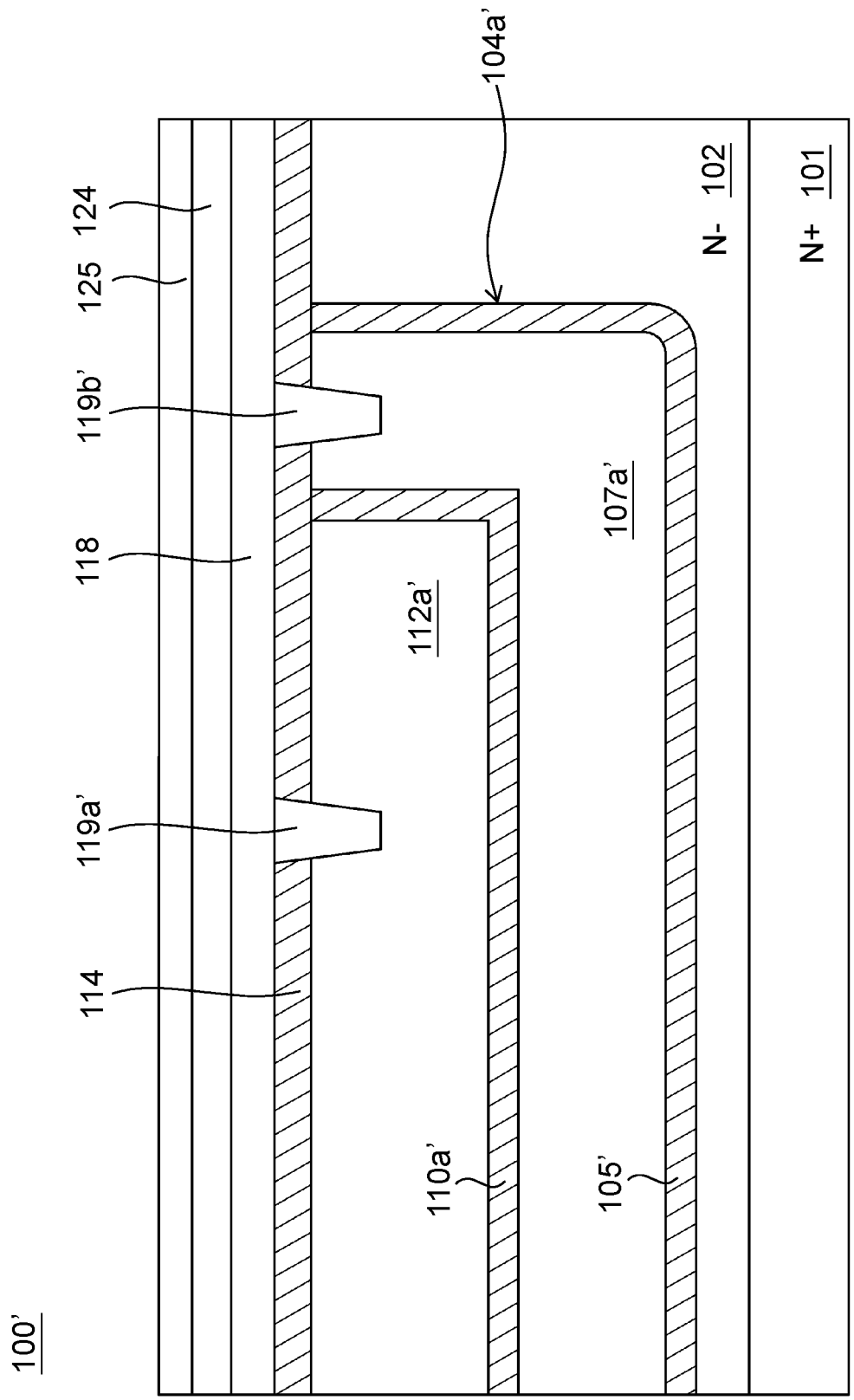
FIG. 2D is a partial cross-sectional structural view of a power semiconductor device according to another embodiment of the disclosure.

Referring to FIG. 2D, FIG. 2D is a partial cross-sectional structural view of a power semiconductor device 100' according to another embodiment of the disclosure. In some embodiments of the disclosure, the manufacturing method and structure of contact plugs 119a' and 119b' which are located in a termination trench 104a' and connect the upper termination electrode 112a' and the lower termination electrode 107a' may be different from the above embodiment. The connections of the upper termination electrode 112a' and the lower termination electrode 107a' be set in advance. In some embodiments, the lower termination electrode 107a' further extends to surround the sidewall of a dielectric isolating layer 110a'. To form the lower termination electrode 107a', after the termination trench 104a' is formed, a dielectric layer 105' is first formed on the bottom and the sidewall of the trench, and then a polysilicon material layer is formed in the trench and on the epitaxial layer 102. Afterwards, an etch-back process is performed on the polysilicon material layer until the surface of the epitaxial layer 102 is exposed. Next, a mask layer (not shown) is formed to mask the surface of the polysilicon material layer around the portion where the upper termination electrode 112a' is to be formed, and then a etch-back process is performed to form the lower termination electrode 107a'. Afterwards, the mask layer is removed, and then the dielectric isolating layer 110a' and the upper termination electrode 112a' are formed. Next, a dielectric protective layer 114 is formed, and then multiple openings are formed in the dielectric protective layer 114. Next, the contact plugs 119a' and 119b' are formed in the openings, and a contact metal layer 118, an upper dielectric layer 124, and a passivation layer 125 are formed on the dielectric protective layer 114. In this embodiment, the contact plugs 119a' and 119b' may be formed at the same time. The contact plug 119a' connects the upper termination electrode 112a'. The contact plug 119b' passes through the dielectric protective layer 114 to directly connect to the lower termination electrode 107a', and it is not required to form a via opening passing through the upper termination electrode 112a' and the dielectric isolating layer 110a'. Therefore, when the upper termination electrode 112a', the lower termination electrode 107a', the dielectric isolating layer 110a', and the dielectric layer 105' are formed, the lower termination electrode 107a' may be directly extended upward at the position where the contact plug 119b' is to be formed and is electrically insulated from the upper termination electrode 112a'. Then, a metal material is directly filled in the via openings to form the contact plugs 119a' and 119b' to respectively electrically connect the upper termination electrode 112a' and the lower termination electrode 107a' to the contact metal layer 118, and it is not required to form a dielectric layer on the sidewall of the via opening.

Figure 3:
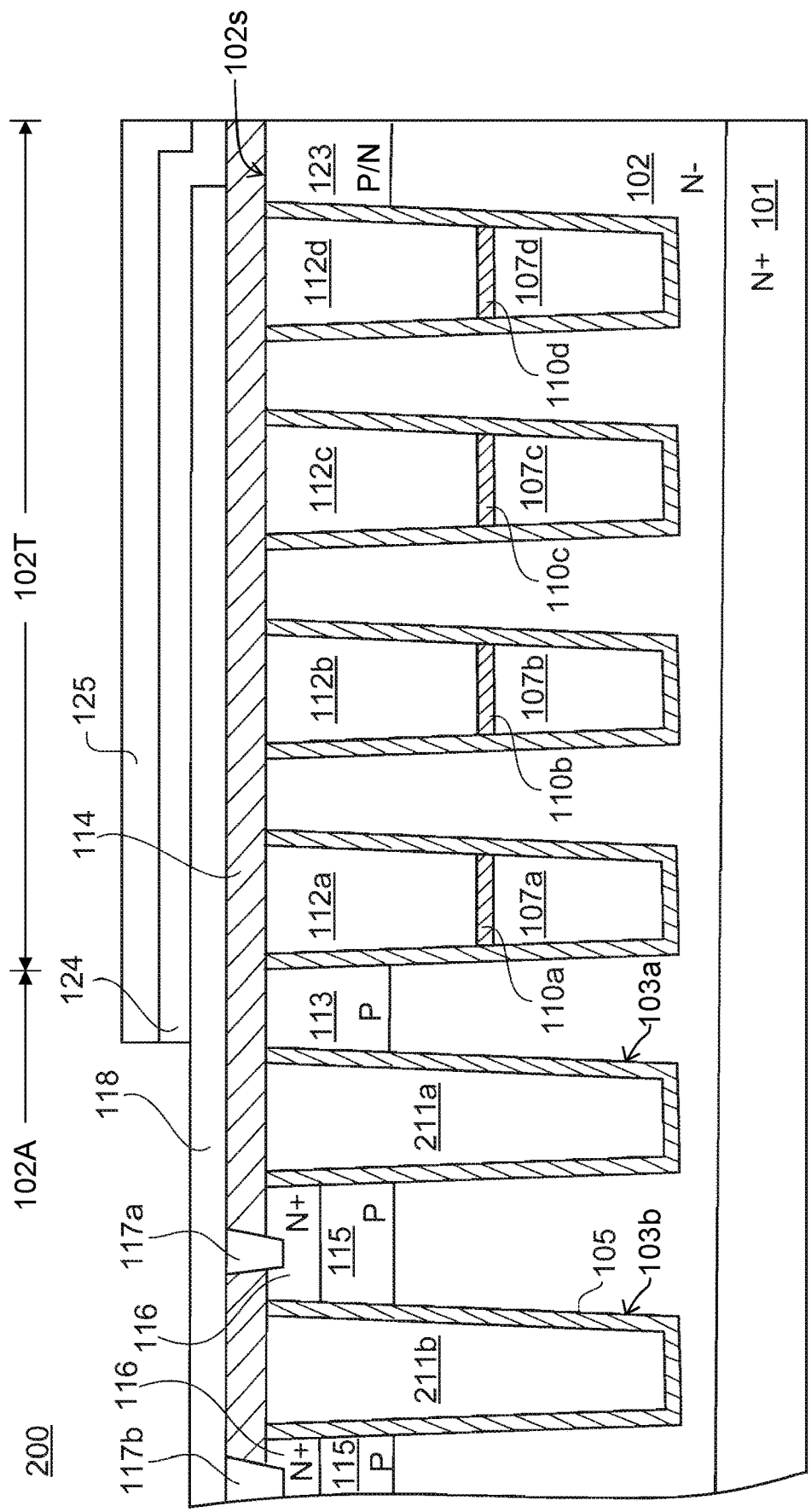
FIG. 3 is a partial cross-sectional structural view of a power semiconductor device according to another embodiment of the disclosure.

Referring to FIG. 3, FIG. 3 is a partial cross-sectional structural view of a power semiconductor device 200 according to another embodiment of the disclosure. The structure of the power semiconductor device 200 is substantially similar to the structure of the power semiconductor device 100, and the difference lies in that the structures of gates 211a and 211b in the active region 102A of the power semiconductor device 200 are different. In this embodiment, the device trenches 103a and 103b are respectively fully filled with the gates 211a and 211b without including any separated electrodes. In addition, the conductivity type of the annular doped region 123 of the power semiconductor device 200 is not limited to the p-type. In an embodiment, the annular doped region 123 of the power semiconductor device 200 may be an n-type doped well region (not shown) extending from the surface 102s of the epitaxial layer 102 into the epitaxial layer 102.

Figure 4:
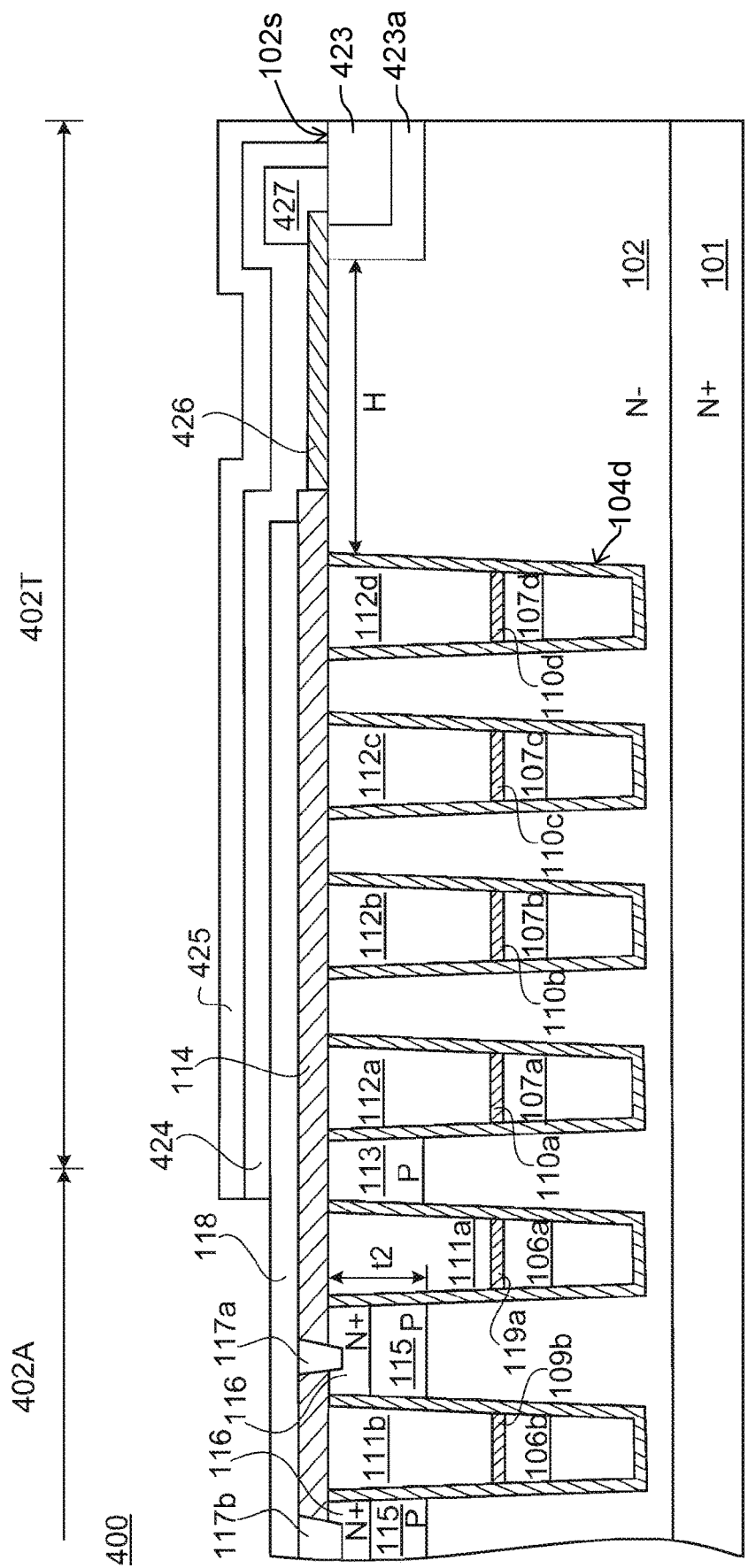
FIG. 4 is a partial cross-sectional structural view of a power semiconductor device according to another embodiment of the disclosure.

Referring to FIG. 4, FIG. 4 is a partial cross-sectional structural view of a power semiconductor device 400 according to another embodiment of the disclosure. The structure of the power semiconductor device 400 in an active region 402A is substantially similar to the structure of the power semiconductor device 100 in the active region 102A, and the difference lies in that an annular doped region 423 of the power semiconductor device 400 is extended to the periphery of a termination region 402T by a distance H, so that the annular doped region 423 is not in direct contact with the termination trench 104d. In addition, the termination region 402T further includes an insulating layer 426 (e.g., an oxide layer) and a metal pad 427. The metal pad 427 is in electrical contact with part of the surface of the annular doped region 423 and covers part of the top surface of the insulating layer 426 to reduce the impact of the electric field on the insulating layer 426 and improve the reliability of the device.

In this embodiment, the oxide layer 426 covers the surface 102s of the epitaxial layer 102 in the termination region 402T, partially overlaps with the annular doped region 423 located in the termination region 402T, and is covered in an upper dielectric layer 424 and a passivation layer 425. The annular doped region 423 may be a p-type or n-type (indicated by P/N) doped well region 423a extending from the surface 102s of the epitaxial layer 102 into the epitaxial layer 102. The metal pad 427 is located on the annular doped region 423 and the oxide layer 426, is in electrical contact with the annular doped region 423, and is covered by the dielectric layer 424 and the passivation layer 425, which can further provide improved charge balance of the power semiconductor device 400.

According to the above embodiments, the disclosure provides a power semiconductor device and a manufacturing method thereof. At least one trench is provided in the termination region of the power semiconductor device having a trench structure. At least two termination electrode field plates vertically stacked on each other and isolated from each other are disposed in the trench and are both electrically connected to the source or are both floating; alternatively, one of them is electrically connected to the source and the other is floating. The power semiconductor device having a trench structure may be (but is not limited to), for example, a metal-oxide-semiconductor field-effect transistor, a metal-oxide-semiconductor Schottky diode, a Schottky barrier diode, or another suitable power semiconductor device. In addition, the number of trenches and the selection of the connections of the termination electrode field plates may be designed in advance according to the electric field requirements during the operation of the power semiconductor device to thereby improve the charge balance of the power metal-oxide-semiconductor transistor cell.

Although the disclosure has been disclosed with the embodiments above, the embodiments are not intended to limit the disclosure. Any person skilled in the art may make some changes and modifications without departing from the spirit and scope of the disclosure. Therefore, the protection scope of the disclosure shall be defined by the claims.

What is claimed is:

1. A power semiconductor device comprising:
an epitaxial layer of a first conductivity type, comprising an active region and a termination region;
a first doped region of a second conductivity type, located in the epitaxial layer of the active region;
a second doped region of the first conductivity type, located in the first doped region;
a contact metal layer located on the epitaxial layer and being in electrical contact with the second doped region, wherein the contact metal layer is not in contact with the first doped region of the second conductivity type;
a device electrode located in a device trench in the active region and electrically isolated from the epitaxial layer and the contact metal layer;
a first termination electrode located in a first termination trench in the termination region and electrically isolated from the epitaxial layer;
a second termination electrode located at a bottom of the first termination trench and electrically isolated from the first termination electrode and the epitaxial layer, wherein both the first termination electrode and the second termination electrode are capable of being selectively floating or in electrical contact with the contact metal layer,
a third termination electrode located in a second termination trench in the termination region away from the active region, wherein the third termination electrode is electrically isolated from the epitaxial layer; and
a fourth termination electrode located at a bottom of the second termination trench and electrically isolated from the third termination electrode and the epitaxial layer, wherein both the third termination electrode and the fourth termination electrode are capable of being selective floating or in electrical contact with the contact metal layer;
a first dielectric isolating layer between the first termination electrode and the second termination electrode;
a second dielectric isolating layer between the third termination electrode and the fourth termination electrode;
a first dielectric layer on a bottom and sidewalls of the device electrode to isolate the device electrode from the epitaxial layer, wherein sidewalls and a bottom of the first dielectric layer are in contact with the epitaxial layer;
second dielectric layers on bottoms and sidewalls of the second termination electrode and the fourth termination electrode to isolate the second termination electrode and the fourth termination electrode from the epitaxial layer, wherein sidewalls and a bottom of the second dielectric layers are in contact with the epitaxial layer;
a doped well region extending from a surface of the epitaxial layer into the epitaxial layer;
an annular doped region in the doped well region, wherein the annular doped region is separated from a periphery of the termination region by a distance;
an insulating layer covering a part of a surface of the annular doped region; and
a metal pad being in electrical contact with another part of the surface of the annular doped region and covering a part of a top surface of the insulating layer,
wherein the contact metal layer continuously covers the second doped region and the first termination electrode to the third termination electrode from the device electrode.

2. The power semiconductor device according to claim 1, wherein any of the first termination electrode and the second termination electrode that is not floating is electrically connected to the contact metal layer.

3. The power semiconductor device according to claim 1, further comprising a separated electrode located at a bottom of the device trench, wherein the separated electrode is electrically isolated from the device electrode and the epitaxial layer and is electrically connected to the contact metal layer.

4. The power semiconductor device according to claim 3, wherein the device electrode is located on the separated electrode and is electrically isolated from the separated electrode by a third dielectric isolating layer, and
the device electrode and the separated electrode are electrically isolated from the epitaxial layer by the first dielectric layer.

5. The power semiconductor device according to claim 1, wherein the contact metal layer covers the termination region and is electrically isolated from the termination region by a third dielectric layer.

6. The power semiconductor device according to claim 1, further comprising a boundary doped region of the second conductivity type, wherein the boundary doped region is located between the device trench and the first termination trench and is electrically isolated from the contact metal layer.

7. The power semiconductor device according to claim 1, wherein the second termination electrode and the third termination electrode are respectively in electrical contact with the contact metal layer via a contact, and sidewalls and bottom of the contact are in contact with the second doped region, and the contact does not extend to the first doped region under the second doped region.

8. The power semiconductor device according to claim 1, wherein the first termination electrode and the second termination electrode are respectively in electrical contact with the contact metal layer via a contact.

9. The power semiconductor device according to claim 1, wherein the fourth termination electrode extends upward to surround a sidewall of the third termination electrode and is electrically isolated from the third termination electrode and the epitaxial layer.

10. The power semiconductor device according to claim 9, wherein the fourth termination electrode and the third termination electrode are respectively in electrical contact with the contact metal layer.

11. The power semiconductor device according to claim 1, further comprising:
    another device electrode located in another device trench in the active region extending into the epitaxial layer, wherein the another device electrode is electrically isolated from the epitaxial layer and the contact metal layer; and
    a fourth dielectric layer on a bottom and sidewalls of the another device electrode to isolate the another device electrode from the epitaxial layer, wherein a bottom and sidewalls of the fourth dielectric layer are in contact with the epitaxial layer.

12. A method for manufacturing a power semiconductor device, comprising:
    providing an epitaxial layer, wherein the epitaxial layer is of a first conductivity type and comprises an active region and a termination region;
    forming a first doped region in the epitaxial layer of the active region, wherein the first doped region is of a second conductivity type;
    forming a second doped region in the first doped region, wherein the second doped region is of the first conductivity type;
    forming a contact metal layer on the epitaxial layer, wherein the contact metal layer is in electrical contact with the second doped region, wherein the contact metal layer is not in contact with the first doped region of the second conductivity type;
    forming a device electrode in the active region, wherein the device electrode is located in a device trench extending into the epitaxial layer and is electrically isolated from the epitaxial layer and the contact metal layer;
    forming a first termination electrode in the termination region, wherein the first termination electrode is located in a first termination trench extending into the epitaxial layer and is electrically isolated from the epitaxial layer;
    forming a second termination electrode at a bottom of the first termination trench, wherein the second termination electrode is electrically isolated from the first termination electrode and the epitaxial layer, wherein both the first termination electrode and the second termination electrode are capable of being selectively floating or in electrical contact with the contact metal layer;
    forming a third termination electrode located in a second termination trench in the termination region away from the active region, wherein the third termination electrode is electrically isolated from the epitaxial layer; and
    forming a fourth termination electrode located at a bottom of the second termination trench and electrically isolated from the third termination electrode and the epitaxial layer, wherein both the third termination electrode and the fourth termination electrode are capable of being selective floating or in electrical contact with the contact metal layer;
    forming a first dielectric isolating layer between the first termination electrode and the second termination electrode;
    forming a second dielectric isolating layer between the third termination electrode and the fourth termination electrode;
    forming a first dielectric layer on a bottom and sidewalls of the device electrode to isolate the device electrode from the epitaxial layer, wherein sidewalls and a bottom of the first dielectric layer are in contact with the epitaxial layer;
    forming second dielectric layers on bottoms and sidewalls of the second termination electrode and the fourth termination electrode to isolate the second termination electrode and the fourth termination electrode from the epitaxial layer, wherein sidewalls and a bottom of the second dielectric layers are in contact with the epitaxial layer;
    forming a doped well region extending from a surface of the epitaxial layer into the epitaxial layer;
    forming an annular doped region in the doped well region, wherein the annular doped region is separated from a periphery of the termination region by a distance;
    forming an insulating layer covering a part of a surface of the annular doped region; and
    forming a metal pad being in electrical contact with another part of the surface of the annular doped region and covering a part of a top surface of the insulating layer, wherein the contact metal layer continuously covers the second doped region and the first termination electrode to the third termination electrode from the device electrode.

13. The method for manufacturing a power semiconductor device according to claim 12, wherein the device trench and the first termination trench are formed simultaneously, and the device electrode and the first termination electrode are formed simultaneously.

14. The method for manufacturing a power semiconductor device according to claim 12, wherein
    the step of forming the second termination electrode at the bottom of the first termination trench is performed before the step of forming the first termination electrode in the termination region, and
    the step of forming the first doped region in the epitaxial layer of the active region is performed after of the step of forming the first termination electrode in the termination region.

15. The method for manufacturing a power semiconductor device according to claim 12, further comprising forming multiple contacts connected to the contact metal layer to respectively connect the first termination electrode, the second termination electrode, the third termination electrode, or the fourth termination electrode.

* * * * *